(12) United States Patent  
An et al.

(10) Patent No.: US 12,500,214 B2
(45) Date of Patent: Dec. 16, 2025

(54) SEMICONDUCTOR PACKAGE

(71) Applicant: SAMSUNG ELECTRONICS CO., LTD., Suwon-si (KR)

(72) Inventors: Hee Woo An, Seoul (KR); Kyung Suk Oh, Seongnam-si (KR); Man ho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 925 days.

(21) Appl. No.: 17/389,561

(22) Filed: Jul. 30, 2021

(65) Prior Publication Data

US 2022/0045038 A1 Feb. 10, 2022

(30) Foreign Application Priority Data

Aug. 7, 2020 (KR) ........................ 10-2020-0099227

(51) Int. Cl.
*H01L 25/16* (2023.01)
*H01L 23/31* (2006.01)
*H01L 23/538* (2006.01)

(52) U.S. Cl.
CPC ........ *H01L 25/162* (2013.01); *H01L 23/3128* (2013.01); *H01L 23/5385* (2013.01)

(58) Field of Classification Search
CPC H01L 25/162; H01L 23/3128; H01L 23/5385
See application file for complete search history.

(56) References Cited

U.S. PATENT DOCUMENTS

| 7,209,366 | B2 | 4/2007 | Prokofiev et al. | |
|---|---|---|---|---|
| 9,331,054 | B2 | 5/2016 | Chang et al. | |
| 10,147,690 | B2 | 12/2018 | Kariyazaki | |
| 10,593,618 | B2 | 3/2020 | Cheah et al. | |
| 2015/0091179 | A1* | 4/2015 | Shenoy ................. | H10B 12/00 438/109 |
| 2018/0366456 | A1 | 12/2018 | Jeong et al. | |
| 2019/0006277 | A1* | 1/2019 | Cheah ...................... | H01G 4/30 |
| 2019/0295999 | A1 | 9/2019 | Jeong et al. | |
| 2019/0363157 | A1 | 11/2019 | Karashima | |
| 2020/0105663 | A1* | 4/2020 | Tsai .................... | H01L 23/5389 |
| 2021/0193616 | A1* | 6/2021 | Cheah ................. | H01L 23/5384 |

(Continued)

FOREIGN PATENT DOCUMENTS

| JP | 2018510127 A | 4/2018 |
|---|---|---|
| JP | 2020072270 A | 5/2020 |
| KR | 1020160079374 A | 7/2016 |

(Continued)

OTHER PUBLICATIONS

First Office Action dated Aug. 2, 2024 for corresponding application No. KR 10-2020-0099227.

(Continued)

*Primary Examiner* — Jacob Y Choi
*Assistant Examiner* — Neil R Prasad
(74) *Attorney, Agent, or Firm* — Muir Patent Law, PLLC

(57) ABSTRACT

A semiconductor package including a first package including a memory chip having a memory cell, and a capacitor structure disposed independently of the memory chip; and a second package including a logic chip configured to access the memory cell, wherein the capacitor structure is electrically connected to the memory chip and the logic chip.

21 Claims, 6 Drawing Sheets

(56) References Cited

U.S. PATENT DOCUMENTS

2021/0225780 A1\* 7/2021 Wu .................. H01L 21/486

FOREIGN PATENT DOCUMENTS

| KR | 10-1717982 B1 | 3/2017 |
| KR | 10-1939046 B1 | 1/2019 |
| KR | 10-2019-0105329 A | 9/2019 |
| KR | 10-2020-0092236 A | 8/2020 |
| WO | 2018047498 A1 | 3/2018 |

OTHER PUBLICATIONS

Algi, Melek Pamuk, et al., "Design and synthesis of new 4, 4'-difluoro-4-bora-3a, 4a-diaza-s-indacene based electrochromic polymers," Electrochimica Acta 109 (2013): 766-774.

Chen, Yinghui, et al., "Geometry relaxation-induced large Stokes shift in red-emitting borondipyrromethenes (BODIPY) and applications in fluorescent thiol probes," The Journal of organic chemistry 77.5 (2012): 2192-2206.

Epelde-Elezcano, Nerea, et al., "Rational design of advanced photosensitizers based on orthogonal BODIPY dimers to finely modulate singlet oxygen generation," Chemistry—A European Journal 23.20 (2017): 4837-4848.

Gai, Lizhi, et al., "Synthesis and spectroscopic properties of bodipy dimers with effective solid-state emission," RSC Advances 2.23 (2012): 8840-8846.

\* cited by examiner

SEMICONDUCTOR PACKAGE

CROSS-REFERENCE TO RELATED APPLICATION

Korean Patent Application No. 10-2020-0099227, filed on Aug. 7, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

Semiconductor packaging is a process of packaging a semiconductor chip to electrically connect the semiconductor chip (or semiconductor die) to an electronic device.

For high integration of semiconductor devices, methods of stacking semiconductor elements have been considered. For example, a multi-chip package in which a plurality of chips are mounted in one semiconductor package or a system-in-package in which stacked heterogeneous chips operate as a single system, have been considered.

SUMMARY

The embodiments may be realized by providing a semiconductor package including a first package including a memory chip having a memory cell, and a capacitor structure disposed independently of the memory chip; and a second package including a logic chip configured to access the memory cell, wherein the capacitor structure is electrically connected to the memory chip and the logic chip.

The embodiments may be realized by providing a semiconductor package including an integrated stack capacitor (ISC) including a first surface and a second surface opposite to the first surface; a memory chip having one surface on the first surface of the ISC and including a plurality of memory cells; and a logic chip having one surface on the second surface of the ISC and being configured to access the memory cell, wherein the ISC is electrically connected to the memory chip and electrically connected to the logic chip.

The embodiments may be realized by providing a semiconductor package including a memory chip including a memory cell; a logic chip configured to access the memory cell; and an integrated stack capacitor (ISC) electrically connected to the memory chip and electrically connected to the logic chip.

BRIEF DESCRIPTION OF THE DRAWINGS

Features will be apparent to those of skill in the art by describing in detail exemplary embodiments with reference to the attached drawings in which.

DETAILED DESCRIPTION

Semiconductor packages according to some embodiments will be described with reference to FIGS. 1 to 7 below.

Figure 1:
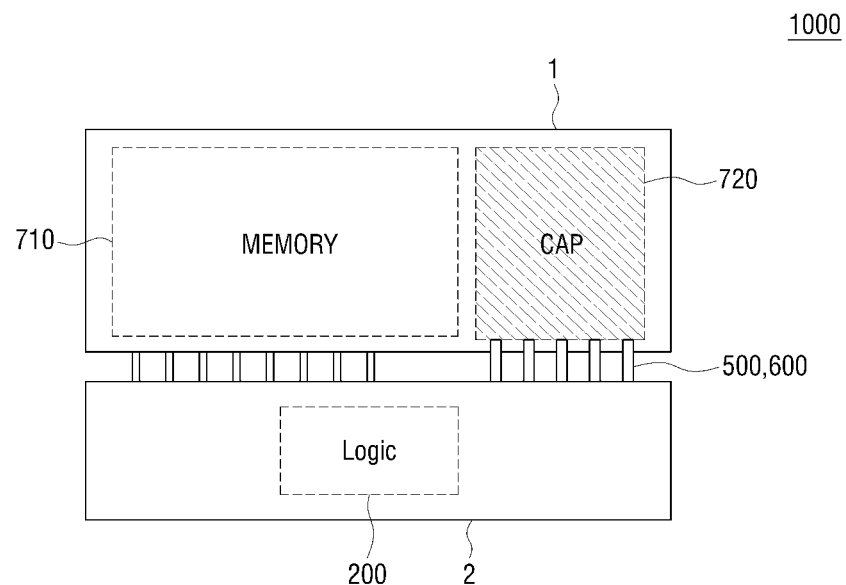
FIG. 1 is a schematic layout diagram of a semiconductor package according to some embodiments.

FIG. 1 is a schematic layout diagram of a semiconductor package according to some embodiments.

Referring to FIG. 1, a semiconductor package 1000 according to some embodiments may include a first package 1 and a second package 2. The first package 1 and the second package 2 may be electrically connected through interconnection structures 500 and 600.

The first package 1 may include a memory chip 710 and a capacitor structure 720, and the second package 2 may include a logic chip 200.

Figure 2:
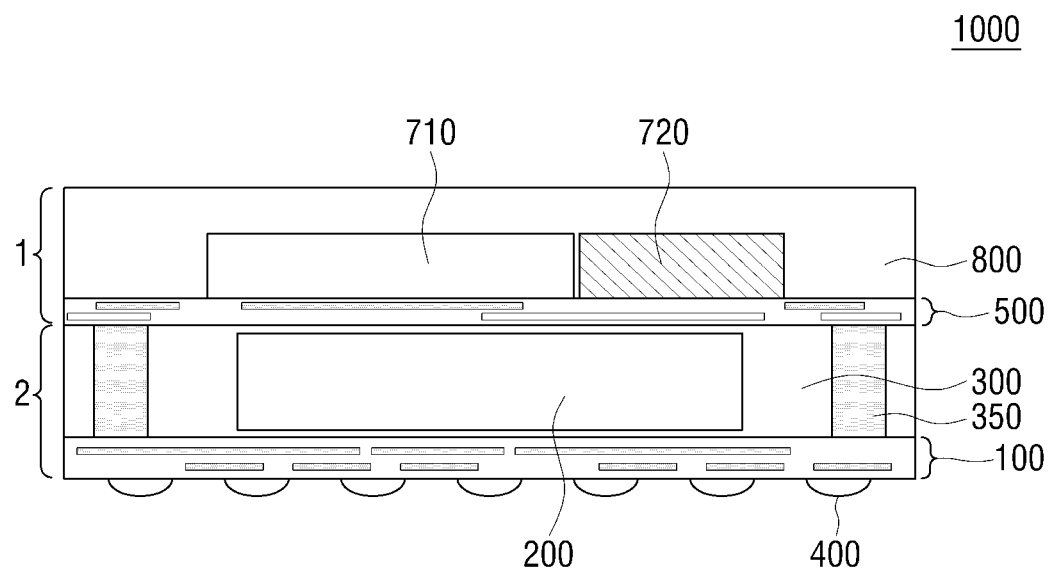
FIG. 2 is a cross-sectional view of a semiconductor package according to some embodiments.
Figure 3A:
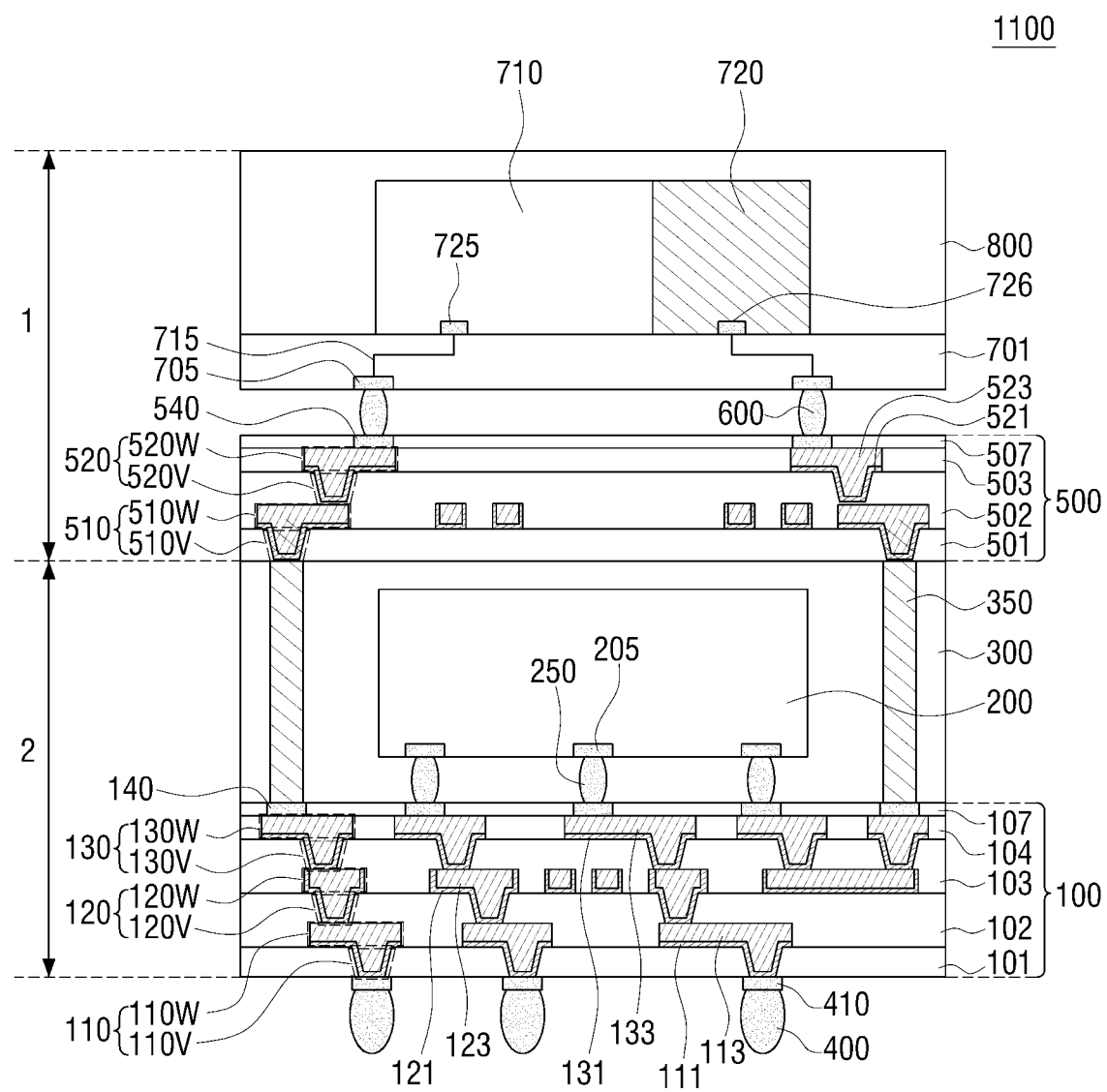
FIGS. 3A and 3B are detailed diagrams of the semiconductor package of FIG. 2 according to some embodiments.
Figure 3B:
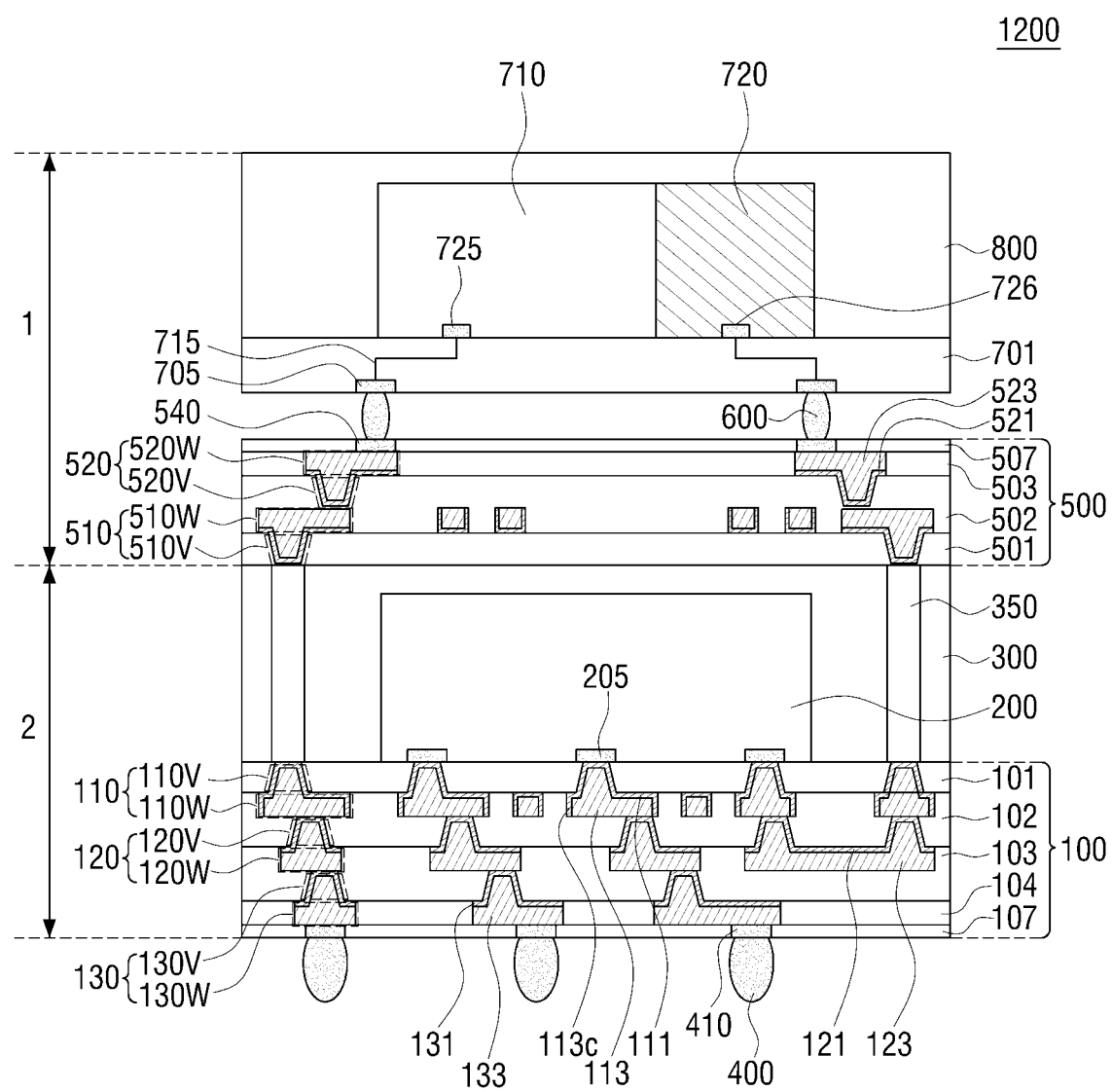

FIG. 2 is a cross-sectional view of a semiconductor package according to some embodiments. FIGS. 3A and 3B are detailed diagrams of the semiconductor package of FIG. 2 according to some embodiments.

Referring to FIGS. 2, 3A, and 3B, a semiconductor package 1000 according to some embodiments may have a stacked Package-on-Package (PoP) structure. The first package 1 and the second package 2 may be packages that are made by individually packaging and on which an electrical test is performed. The semiconductor package 1000 may be a System-In-Package (SIP) in which several types of semiconductor devices having different functions are assembled into one package to maximize product performance and efficiency.

In an implementation, the first package 1 may be a structure stacked on the second package 2.

In an implementation, the first package 1 may include a first interconnection structure 500, a memory chip 710, a capacitor structure 720, and a molding part 800.

The memory chip 710 may include a memory cell array including a plurality of memory cells. In an implementation, the memory chip 710 may further include an internal decoupling capacitor.

The capacitor structure 720 may be on a portion of an upper surface of a first interconnection structure 500 on which the memory chip 710 is not disposed. The capacitor structure 720 may be a decoupling capacitor that operates independently from the memory chip 710 in one package. The decoupling capacitor may help remove radio-frequency energy injected into a power supply network, may act as a local power supply that supplies power, and may help reduce a peak of a current surge propagating in a substrate.

The first interconnection structure 500 may be a substrate on or in which a plurality of first interconnections are formed and may include a rigid printed circuit board, a flexible printed circuit board, or a rigid-flex printed circuit board. The first interconnection structure 500 may include a plurality of first interconnection layers 510W, 520W, and 523, a plurality of first vias 510V and 520V for connecting at least two first interconnection layers, and a plurality of first insulating layers 501, 502, 503, and 507. A ground voltage and a power supply voltage may be applied to at least one of the plurality of first interconnections.

Each of the first insulating layers 501, 502, 503, and 507 may include, e.g., a photo imageable dielectric (PID). A photolithography process may be performed on the PID, and the PID may be manufactured at a wafer level. Accordingly, when each of the first insulating layers 501, 502, 503, and 507 includes a PID, each of the first insulating layers 501, 502, 503, and 507 may be formed to be thinner, and the first interconnection layers 510W, 520W, and 523 and the first vias 510V and 520V may be formed with a finer pitch.

The first insulating layers 501, 502, 503, and 507 may include the same material or different materials. In FIGS. 3A to 3B, boundaries of the insulating layers 501, 502, 503, and 507 are illustrated only for convenience of description. In an implementation, the boundaries of the insulating layers 501, 502, 503, 507 may be unclear depending on a process of forming the insulating layers 501, 502, 503, and 507 or a material of the insulating layers 501, 502, 503, and 507 (e.g., when the layers include the same materials, interfaces or boundaries therebetween may be indistinct).

The plurality of first interconnection layers 510W, 520W, and 523 may be formed in the first insulating layers 501, 502, 503, and 507. In an implementation, the first interconnection structure 500 may include the first interconnection layers 510W, 520W, and 523 that are sequentially stacked in a direction from a first surface of the first interconnection structure 500 toward a second surface thereof. In an implementation, the number, location, or arrangement thereof may vary.

The first interconnection layers 510W, 520W, and 523 are illustrated to have the same size only for convenience of description. In an implementation, a thickness of the first interconnection layers 510W, 520W and 523 may increase from top to bottom. In an implementation, the thickness of the first interconnection layer 510W may be greater than that of the first interconnection layer 520W.

Each of the first interconnection layers 510W, 520W, and 523 may include a conductive material. Accordingly, the first interconnection layers 510W, 520W, and 523 may redistribute chip pads 725 and 726 of the memory chip 710 to be described below. In an implementation, each of the first interconnection layers 510W, 520W, and 523 may include, e.g., copper (Cu), aluminum (Al), silver (Ag), tin (Sn), gold (Au), nickel (Ni), lead (Pb), titanium (Ti), or an alloy thereof. As used herein, the term "or" is not an exclusive term, e.g., "A or B" would include A, B, or A and B.

The first interconnection layers 510W, 520W, and 523 may perform various functions according to the design thereof. In an implementation, the first interconnection layers 510W, 520W, and 523 may include a ground pattern, a power pattern, a signal pattern, or the like. Various electrical signals, e.g., data electrical signals or the like, excluding a ground signal, a power signal, and the like may be input to or output from the signal pattern.

The plurality of vias 510V and 520V may pass through the insulating layers 501, 502, 503, and 507 to connect the first interconnection layers 510W, 520W and 523. In an implementation, the first interconnection structure 500 may include the plurality of vias 510V and 520V. In an implementation, the via 510V may pass through the first insulating layer 501 and be connected to a through-via 350 connecting the second interconnection structure 100, and the via 520V may pass through the first insulating layer 502 to connect the first interconnection layer 510W and the first interconnection layer 520W. In an implementation, the number, location, or arrangement of vias may vary.

The vias 510V and 520V are illustrated to have the same size only for convenience of description. In an implementation, widths of the vias 510V and 520V may decrease from top to bottom as illustrated in FIG. 3A.

In an implementation, as illustrated in the drawings, trenches in the first insulating layers 501, 502, 503, and 507 may be completely filled with the vias 510V and 520V. In an implementation, the vias 510V and 520V may have a shape extending along profiles of the trenches in the insulating layers 501, 502, 503 and 507.

The vias 510V and 520V may include a conductive material. Accordingly, an electrical path connecting an upper surface and a lower surface of the first interconnection structure 500 may be formed in the first interconnection structure 500. In an implementation, each of the vias 510V and 520V may include, e.g., copper (Cu), aluminum (Al), silver (Ag), tin (Sn), gold (Au), nickel (Ni), lead (Pb), titanium (Ti), or an alloy thereof.

A barrier layer 521 may surround the vias 510V and 520V and (e.g., at least a part of) the interconnection layers 510W and 520W. In an implementation, as illustrated in FIGS. 3A and 3B, the barrier layer 521 may be formed by various deposition processes such as a chemical vapor deposition (CVD) process or an atomic layer deposition (ALD) process. The barrier layer 111 may include a metal material or a nitride of the metal material.

The memory chip 710 and the capacitor structure 720 may be mounted on a first surface (e.g., upper surface) of the first interconnection structure 500. In an implementation, a chip area (on which the memory chip 710 and the capacitor structure 720 is mounted) and a fan-out area (around the chip area) may be provided. The chip area may be an area of the first interconnection structure 500 on which the memory chip 710 and the capacitor structure 720 overlap the first interconnection structure 500, and the fan-out area may be the remaining area of the first interconnection structure 500 except for the chip area. In an implementation, the fan-out area may be an area of the first interconnection structure 500 that does not overlap (e.g., underlie) the memory chip 710 and the capacitor structure 720. In an implementation, the overlapping refers to the overlapping in a direction crossing the upper surface of the first interconnection structure 500. In an implementation, the fan-out area may surround the chip area.

In an implementation, a chip area (on which the memory chip 710 and the capacitor structure 720 is mounted) and a fan-in area (overlapping the chip) area may be provided. The chip area may be an area of the first interconnection structure 500 on which the memory chip 710 and the capacitor structure 720 overlap the first interconnection structure 500, and the fan-in area may be a region of the first interconnection structure 500 below the chip area. In an implementation, the fan-in area may be an area of the first interconnection structure 500 overlapping the memory chip 710 and the capacitor structure 720.

In an implementation, each of semiconductor packages 1100 and 1200 may further include a redistribution structure 700 between the memory chip 710 and the capacitor structure 720. In this case, a first interconnection structure 500 may include interconnection pads 540 on an upper surface thereof. Solder balls 600 may be on the interconnection pads 540. The redistribution structure 700 may be on an upper surface of each of the solder balls 600. The solder balls 600 may be in contact with the interconnection pads 540. Thus, the solder ball 600 may be electrically connected to the first interconnection structure 500. Each of the solder balls 600 may include, e.g., lead (Pb), tin (Sn), indium (In), bismuth (Bi), antimony (Sb), silver (Ag), or an alloy thereof.

The redistribution structure 700 may include a plurality of interconnections 715, an insulating layer 701 (for insulation and passivation), lower lands 705, and upper lands 725 and 726 (e.g., chip pads).

The lower lands 705 and the upper lands 725 and 726 may be vertically provided on upper and lower surfaces of an insulating layer 701, and may be electrically connected via interconnections 715. In an implementation, the lower lands 705 and the upper lands 725 and 726 may be input/output terminals of the memory chip 710 and the capacitor structure 720. In some embodiments, the lower lands 705 and the upper lands 725 and 726 may be power supply terminals of the memory chip 710 and the capacitor structure 720. In an implementation, as illustrated in the drawings, the interconnections 715 may vertically connect only the upper lands 725 and 726 and the lower lands 705, or may be a redistribution layer (RDL), interposers, through-vias (TSVs), wire bonding, or the like, and may connect the memory chip 710 and the capacitor structure 720 according to another embodiment.

Accordingly, the memory chip 710 and the capacitor structure 720 may be electrically connected by the redistribution structure 700 so that the memory chip 710 may use the capacitor structure 720.

The molding part 800 may be on an upper surface of the redistribution structure 700. The molding part 800 may cover at least portions of the memory chip 710 and the capacitor structure 720. In an implementation, the molding part 800 may cover a fan-out area of the redistribution structure 700.

In an implementation, as illustrated in FIGS. 2, 3A, and 3B, the molding part 800 may cover all side surfaces and the upper surfaces of the memory chip 710 and the capacitor structure 720.

In an implementation, side surfaces of the molding part 800 may be continuous with side surfaces of the redistribution structure 700 or the first interconnection structure 500. This may be due to characteristics of a process of forming the molding part 800. In an implementation, the molding part 800 and the redistribution structure 700 or the first interconnection structure 500 may be cut simultaneously by a singulation process of individually dividing a plurality of semiconductor chips. Accordingly, the side surfaces of the molding part 800 and the side surfaces of the redistribution structure 700 may be continuous with each other.

The molding part 800 may include an insulating material. In an implementation, the molding part 800 may include a thermosetting resin such as an epoxy resin, a thermoplastic resin such as polyimide, a mixture of these resins with an inorganic filler, or a resin impregnated into a core material such as a glass fiber (glass cloth or glass fabric) or the like, together with an inorganic filler (e.g., prepreg, an Ajinomoto build-up film (ABF), FR-4, bismaleimide triazine (BT)), or the like. In an implementation, the molding part 800 may include a PID.

In an implementation, the second package 2 may include a second interconnection structure 100, a logic chip 200, and a molding part 300.

The logic chip 200 may be electrically connected to the memory chip 710 and may access at least one memory cell. In an implementation, data may be written to, read from, or deleted from the at least one memory cell. The logic chip 200 may include, e.g., an analog-digital converter) ADC or an application-specific IC (ASIC).

The performance of the logic chip 200 may be high to operate the logic chip 200 and thus a high-capacitance decoupling capacitor may be used to resist power noise. The logic chip 200 may be electrically connected to the capacitor structure 720 to use the capacitor structure 720 as a decoupling capacitor while sharing the capacitor structure 720 (e.g., with the memory chip 710).

The molding part 300 may be on an upper surface of the second interconnection structure 100. The molding part 300 may cover at least a portion of the logic chip 200.

Furthermore, the molding part 300 may cover a fan-out area of the second interconnection structure 100. In addition, the molding part 300 may include a through-via 350 passing through the fan-out area.

In an implementation, as illustrated in FIGS. 2, 3A, and 3B, the molding part 300 may cover all side surfaces and an upper surface of the logic chip 200.

In an implementation, side surfaces of the molding part 300 may be continuous with side surfaces of the second interconnection structure 100. This may be due to characteristics of a process of forming the molding part 300. In an implementation, the molding part 300 and the second interconnection structure 100 may be cut simultaneously by the singulation process of individually dividing a plurality of semiconductor chips. Accordingly, the side surfaces of the molding part 300 and the side surfaces of the second interconnection structure 100 may be continuous with each other.

The molding part 300 may include an insulating material. In an implementation, the molding part 300 may include a thermosetting resin such as an epoxy resin, a thermoplastic resin such as polyimide, a mixture of these resins with an inorganic filler, or a resin impregnated into a core material such as a glass fiber (glass cloth or glass fabric) or the like, together with an inorganic filler (e.g., prepreg, an Ajinomoto build-up film (ABF), FR-4, bismaleimide triazine (BT)), or the like. In an implementation, the molding part 300 may include a PID.

Referring to FIGS. 2 and 3A, according to some embodiments, the second interconnection structure 100 may be a substrate on or in which a plurality of second interconnections are formed, and may include a rigid printed circuit board, a flexible printed circuit board, or a rigid-flex printed circuit. The second interconnection structure 100 may include a plurality of second interconnection layers 110W, 120W, and 130W, a plurality of second vias 110V, 120V, and 130V (e.g., for connecting at least two second interconnection layers), and a plurality of second insulating layers 101, 102, 103, 104, and 107. A ground voltage and a power supply voltage may be applied to at least one of the plurality of second interconnections.

Each of the second insulating layers 101, 102, 103, 104, and 107 may include, e.g., a PID. A photolithography process may be performed on the PID, and the PID may be manufactured at a wafer level. Accordingly, when each of the second insulating layers 101, 102, 103, 104 and 107 includes the PID, each of the second insulating layers 101, 102, 103, 104 and 107 may be formed to be thinner, and the second interconnection layers 110W, 120W, and 130W and the second vias 110V, 120V, and 130V may be formed with a finer pitch.

The second insulating layers 101, 102, 103, 104, and 107 may include the same material or different materials. In FIG. 3A, boundaries of the insulating layers 101, 102, 103, 104, and 107 are illustrated only for convenience of description. In an implementation, the boundaries of the insulating layers 101, 102, 103, 104, and 107 may be unclear or indistinct depending on the process of forming the insulating layers 101, 102, 103, 104, and 107 or the material of the insulating layers 101, 102, 103, 104, and 107.

The plurality of second interconnection layers 110W, 120W, and 130W may be in the second insulating layers 101, 102, 103, 104, and 107. In an implementation, the second interconnection structure 100 may include first interconnection layers 110W, 120W, and 130W which are sequentially stacked in a direction from a first surface of the second interconnection structure 100 toward a second surface thereof. In an implementation, the number, location, or arrangement thereof may vary.

In an implementation, as illustrated in the drawings, the second interconnection layers 110W, 120W, and 130W may have the same size. In an implementation, the thickness of the second interconnection layers 110W, 120W, and 130W may increase in a direction from top to bottom. In an implementation, the thickness of the interconnection layer 110W may be greater than that of the interconnection layer 120W.

Each of the second interconnection layers 110W, 120W, and 130W may include a conductive material. Accordingly, the second interconnection layers 110W, 120W, and 130W may redistribute the logic chip 200 to be described below. In an implementation, each of the second interconnection layers 110W, 120W, and 130W may include, e.g., copper (Cu), aluminum (Al), silver (Ag), tin (Sn), gold (Au), nickel (Ni), lead (Pb), titanium (Ti), or an alloy thereof.

The second interconnection layers 110W, 120W, and 130W may perform various functions according to the design thereof. In an implementation, the second interconnection layers 110W, 120W, and 130W may include a ground pattern, a power pattern, a signal pattern, or the like. Various electrical signals, e.g., data electrical signals or the like, excluding a ground signal, a power signal, or the like may be input to or output from the signal pattern.

The plurality of second vias 110V, 120V, and 130V may pass through the second insulating layers 101, 102, 103, and 104 to connect the second interconnection layers 110W, 120W, and 130W. In an implementation, the second via 130V may pass through the second insulating layer 103 and be connected to the second interconnection layer 120W, the second via 120V may pass through the second insulating layer 102 and be connected to the second interconnection layer 110W, and the second via 110V may pass through the second insulating layer 101 and be connected to a land or interconnection pad 410. In an implementation, the number, location, or arrangement thereof may vary.

In an implementation, as illustrated in the drawings, the second vias 110V, 120V, and 130V may have the same size. In an implementation, as illustrated in FIG. 3A, the widths of the second vias 110V, 120V, and 130V may decrease in a direction from top to bottom.

In an implementation, as illustrated in the drawings, trenches in the second insulating layers 101, 102, 103, and 104 may be completely filled with the second vias 110V, 120V, and 130V. In an implementation, the second vias 110V, 120V, and 130V may have a shape extending along the profiles of the trenches in the second insulating layers 101, 102, 103, and 104.

Each of the second vias 110V, 120V, and 130V may include a conductive material. Accordingly, an electrical path connecting the upper surface and the lower surface of the second interconnection structure 100 may be in the second interconnection structure 100. In an implementation, each of the second vias 110V, 120V and 130V may include, e.g., copper (Cu), aluminum (Al), silver (Ag), tin (Sn), gold (Au), nickel (Ni), lead (Pb), titanium (Ti), or an alloy thereof.

A barrier layer 111 may surround the second vias 110V, 120V, and 130V and (e.g., at least a part of) the second interconnection layers 110W, 120W, and 130W. In an implementation, as illustrated in FIGS. 3A and 3B, the barrier layer 111 may be formed by various deposition processes such as a CVD process or an ALD process. The barrier layer 111 may include a metal material or a nitride of the metal material.

The logic chip 200 may be mounted on the first surface (e.g., upper surface) of the second interconnection structure 100. In an implementation, a chip area (on which the logic chip 200 is mounted) and a fan-out area (around the chip area) may be provided. In an implementation, a chip area (on which the logic chip 200 is mounted) and a fan-in area (overlapping the chip area) may be provided. In this regard, the above description for the first interconnection structure 500 may be omitted here.

In an implementation, the second package 2 may further include at least one interconnection pad 140 on the upper surface of the second interconnection structure 100. The interconnection pad 140 may be in the second insulating layer 107. The logic chip 200 may include lower lands 205 on a lower surface thereof. In an implementation, the lower lands 205 may be input/output terminals of the logic chip 200.

Solder balls 250 may be between the interconnection pad 140 and the lower lands 205. Accordingly, the solder balls 250 may be electrically connected to the second interconnection structure 100 and the logic chip 200. Each of the solder balls 250 may include, e.g., lead (Pb), tin (Sn), indium (In), bismuth (Bi), antimony (Sb), silver (Ag), or an alloy thereof.

Through-vias 350 may be between an upper surface of the interconnection pad 140 and a lower surface of the first interconnection structure 500 in the fan-out area. The through-vias 350 may be in contact with the interconnection pad 140 and the first via 510V in the first interconnection structure 500. Accordingly, the logic chip 200 may be electrically connected to the second interconnection structure 100, the through-vias 350, and the first interconnection structure 500 to access the memory chip 710 and use the capacitor structure 720 in the power network.

Referring to FIG. 3B, according to some embodiments, in the second package 2, the second interconnection structure 100 may be formed differently from that of FIG. 3A. For convenience of description, a description of parts of FIG. 3B that are the same as those of FIG. 3A may be omitted.

In an implementation, an interconnection pad 410 may be on a lower surface of the second interconnection structure 100. The interconnection pad 410 may be in an insulating layer 107 and may be exposed through the lower surface of the second interconnection structure 100. In addition, the interconnection pad 410 may be electrically connected to the second interconnection structure 100. In an implementation, the interconnection pad 410 may pass through the insulating layer 107 and may be connected to an interconnection layer 130W.

In an implementation, the second interconnection structure 100 may include a plurality of interconnection layers, a plurality of insulating layers, and a plurality of vias. In an implementation, in the second interconnection structure 100, an insulating layer 101, a via 110V, an interconnection layer 110W, an insulating layer 102, a via 120V, an interconnection layer 120W, an insulating layer 103, a via 130V, the interconnection layer 130W, and an insulating layer 104 may be sequentially formed, and a logic chip 200 and a through-via 350 may be on an upper surface of the via 110V. An interconnection pad 410 and solder balls 400 may be on the lower surface of the interconnection layer 130W.

The plurality of vias 110V, 120V, and 130V may pass through the insulating layers 101, 102, 103, and 104 to connect the second interconnection layers 110W, 120W, and 130W. In an implementation, the via 130V may pass through the insulating layer 103 and be connected to the interconnection layer 120W, the via 120V may pass through the insulating layer 102 and be connected to the interconnection layer 110W, and the via 110V may pass through the insulating layer 101 and be connected to the interconnection pad 410. In an implementation, the number, location, or arrangement thereof may vary.

In an implementation, the vias 110V, 120V, and 130V may have the same size.

In an implementation, as illustrated in FIG. 3B, in one embodiment, the widths of the vias 110V, 120V, and 130V may increase in a direction from top to bottom.

Figure 4:
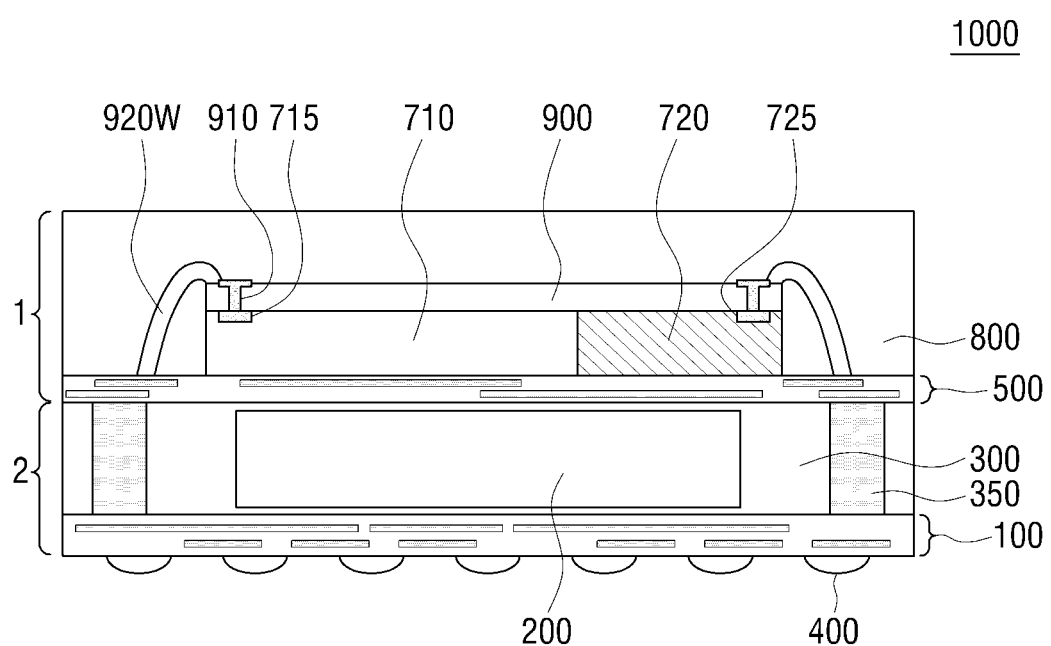
FIG. 4 is a cross-sectional view of a semiconductor package according to some embodiments.

FIG. 4 is a cross-sectional view of a semiconductor package according to some embodiments. For convenience of description, parts of FIG. 4 that are the same as those described above with reference to FIGS. 1 to 3B may be briefly described or omitted here.

Referring to FIG. 4, a first package 1 may further include an integrated stack capacitor (ISC) 900.

In an implementation, the ISC 900 may include at least one stack capacitor. A stack capacitor may include a plurality of planar capacitors which are stacked together and electrodes of which are connected in parallel. The stack capacitor may include, e.g., a crown-stack capacitor, a raw silicon stack capacitor, or the like.

An ISC may be manufactured by a suitable stack capacitor formation process.

In an implementation, an ISC formation process may use a suitable memory manufacturing process to reduce manufacturing costs.

In an implementation, in a first package 1, a memory chip 710 and a capacitor structure 720 may be on an upper surface of a first interconnection structure 500, and the ISC 900 may be on the memory chip 710 and the capacitor structure 720. In an implementation, a stacked structure of the first interconnection structure 500, the memory chip 710, the capacitor structure 720, and the ISC 900 may be provided.

In an implementation, the ISC 900 may include an ISC interconnection pad 910.

The ISC interconnection pad 910 may be connected to an interconnection pad 715 of the memory chip 710 and a chip pad 725 of the capacitor structure 720. The interconnection pad 910 may be connected to one end of a wire 920W. The other end of the wire 920W may be connected to an interconnection pad 540 of the first interconnection structure 500 or a land 705. The ISC 900 may be electrically connected to the first interconnection structure 500 through the wire 920W to be used in the logic chip 200 of the second package 2.

In an implementation, the second package 2 may be formed according to the embodiment of FIG. 3A or 3B.

Figure 5:
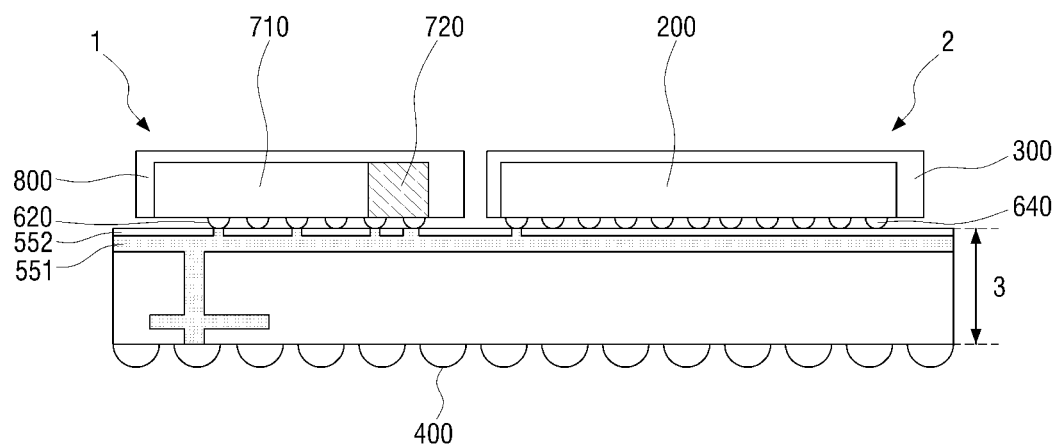
FIG. 5 is a cross-sectional view of a semiconductor package according to some embodiments.

FIG. 5 is a cross-sectional view of a semiconductor package according to some embodiments. For convenience of description, parts of FIG. 5 that are the same as those described above with reference to FIGS. 1 to 3B may be briefly described or omitted here.

In an implementation, a first package 1 may include a first interconnection structure 500, a memory chip 710, and a capacitor structure 720. An internal configuration of the first interconnection structure 500 may be the same as that described above with reference to FIGS. 3A and 3B, but a substrate 3 may be provided under solder balls 620 rather than a second package 2.

In an implementation, the second package 2 may include a second interconnection structure 100 and a logic chip 200. An internal configuration of the second interconnection structure 100 may be the same as that described above with reference to FIG. 3A, but the substrate 3 may be provided under solder balls 640.

In an implementation, a semiconductor package 2000 may include the substrate 3 and may further include the first package 1 and the second package 2 which are independently located on the substrate 3.

In an implementation, the substrate 3 may include an interconnection layer 551 and an insulating layer 552. The interconnection layer 551 may be on an upper surface of the substrate 3, and the insulating layer 552 may be on an upper surface of the interconnection layer 551. The interconnection layer 551 may be electrically connected to the first package 1 and the second package 2 through a plurality of vias passing through the insulating layer 552. The plurality of vias may be connected to lower surfaces of the solder balls 620 and 640 of the first package 1 and the second package 2 to be connected to the interconnection layer 551. The interconnection layer 551 may be electrically connected so that the logic chip 200 may use the capacitor structure 720 separately from the memory chip 710.

The substrate 3 may further include solder balls 400 on a lower surface thereof.

The semiconductor package 2000 may be electrically connected to another device through the solder balls 400.

Figure 6:
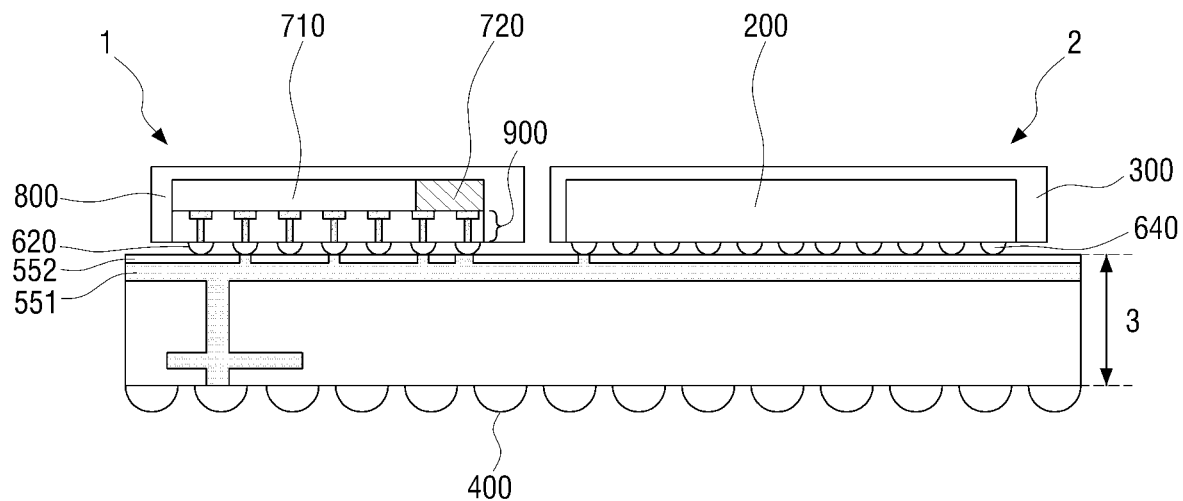
FIG. 6 is a cross-sectional view of a semiconductor package according to some embodiments.

FIG. 6 is a cross-sectional view of a semiconductor package according to some embodiments. For convenience of description, parts of FIG. 6 that are the same as those described above with reference to FIGS. 1 to 3B and 5 may be briefly described or omitted here.

In an implementation, a first package 1 may include a first interconnection structure 500, a memory chip 710, and a capacitor structure 720. In an implementation, the first package 1 may further include an ISC 900.

In an implementation, the ISC 900 may include at least one ISC 900. The ISC 900 may include a plurality of planar capacitors which are stacked together and electrodes of which are connected in parallel. The first package 1 may have a stack structure of the first interconnection structure 500, the ISC 900, the memory chip 710, and the capacitor structure 720.

In an implementation, the ISC 900 may be between the memory chip 710 and the capacitor structure 720 and the first interconnection structure 500.

In an implementation, an upper surface of the ISC 900 may be on lower surfaces of the memory chip 710 and the capacitor structure 720. An upper pad of the ISC 900 may be connected to an interconnection pad 715 of the memory chip 710 and a chip pad 725 of the capacitor structure 720. A lower surface of the ISC 900 may be provided on an upper surface of the first interconnection structure 500. A lower pad of the ISC 900 may be connected to the interconnection pad 540 of the first interconnection structure 500 or a land 705. The ISC 900 may be electrically connected to the first interconnection structure 500 to be used by a logic chip 200 of a second package 2.

Figure 7:
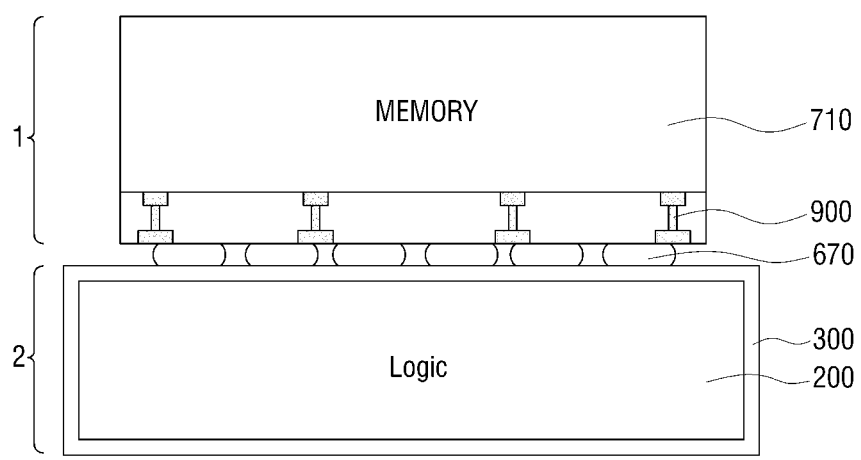
FIG. 7 is a cross-sectional view of a semiconductor package according to some embodiments.

FIG. 7 is a cross-sectional view of a semiconductor package according to some embodiments.

Referring to FIG. 7, according to some embodiments, in a semiconductor package 3000, a logic chip 200, an ISC 900, and a memory chip 710 may be formed by a wafer-on-wafer process.

In the semiconductor package 3000, the memory chip 710 may be on a first wafer and the ISC 900 may be on a lower surface of the memory chip 710. In an implementation, an upper surface of the ISC 900 may be in contact (e.g., direct contact) with the lower surface of the memory chip 710. An interconnection pad of the memory chip 710 may be connected to input/output pads of the ISC 900 to be electrically connected to the ISC 900.

In an implementation, the logic chip 200 may be on a second wafer, and an upper surface of the logic chip 200 may be bonded to a lower surface of the ISC 900. In an implementation, solder balls 670 may be on the upper surface of the logic chip 200, and the solder balls 670 may be connected such that an electrical connection path between the logic chip 200 and the memory chip 710 and an electrical connection path between the ISC 900 and the logic chip 200 may be independent from each other. Accordingly, the memory chip 710 and the logic chip 200 may share (e.g., may be commonly electrically connected to) the ISC 900 independently of each other.

In an implementation, the first wafer may form the memory chip 710 and a decoupling capacitor structure inside the memory chip 710. In this case, the logic chip 200 may use both the ISC 900 and the decoupling capacitor structure inside the memory chip 710.

By way of summation and review, in order to strengthen the resistance of semiconductor devices against power noise, on-chip decoupling capacitors (Decap) may be used therein, and the performance of logic chips should be high to operate the logic chips, and thus high-capacitance capacitors may be used.

As the sizes of semiconductor chips become smaller, semiconductor packages may include input/output terminals outside semiconductor chips using a redistribution layer. In an implementation, a fan-in wafer-level package (FIWLP) semiconductor package, a fan-out wafer-level package (FOWLP) semiconductor package, fan-out panel-level package (FOPLP) semiconductor packages, or the like have been considered.

Semiconductor packages according to some embodiments may be semiconductor packages, the bottom surfaces of which are redistribution structures, such as an FIWLP semiconductor package, an FOPLP semiconductor package, or the like.

One or more embodiments may provide a semiconductor package including a decoupling capacitor.

One or more embodiments may provide a semiconductor package that is resistant to power noise without an external power capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first package including:
a memory chip having a memory cell,
a capacitor structure disposed independently of the memory chip; and
a printed circuit board (PCB) on which the memory chip and the capacitor structure are mounted;
a second package including a logic chip configured to access the memory cell; and
an integrated stack capacitor (ISC) extending across and contacting a surface of the memory chip and a surface of the capacitor structure,
wherein the capacitor structure is electrically connected to the memory chip and the logic chip, and
wherein the PCB is positioned between the logic chip and the memory chip and the capacitor structure.

2. The semiconductor package as claimed in claim 1, wherein:
the first package further includes:
the PCB including at least one first interconnection layer, the memory chip and the capacitor structure being separate from each other and on a first surface of the PCB; and
a first molding part covering a first surface of the memory chip and a first surface of the capacitor structure, and the second package is on a second surface of the PCB, and
the second surface of the PCB being opposite to the first surface of the PCB.

3. The semiconductor package as claimed in claim 2, wherein the second package further includes:
a second interconnection structure including at least one second interconnection layer, the logic chip being on a first surface of the second interconnection structure;
at least one via electrically connecting the PCB to the second interconnection structure; and
a second molding part between the PCB and the second interconnection structure.

4. The semiconductor package as claimed in claim 3, wherein the second package includes a plurality of solder balls on a second surface of the second interconnection structure, the second surface of the second interconnection structure being opposite to the first surface of the second interconnection structure.

5. The semiconductor package as claimed in claim 3, wherein the memory chip and the capacitor structure are electrically connected to the logic chip through the at least one first interconnection layer of the PCB and the at least one via connected to the at least one first interconnection layer.

6. The semiconductor package as claimed in claim 3, wherein the ISC covers both of an upper surface of the memory chip and an upper surface of the capacitor structure, and
wherein the first package further comprises a wire connected to the at least one first interconnection layer in the PCB and connected to the ISC.

7. The semiconductor package as claimed in claim 1, further comprising a substrate,
wherein the first package and the second package are side-by-side on a first surface of the substrate.

8. The semiconductor package as claimed in claim 7, wherein:
the substrate includes a third interconnection layer on the first surface thereof and a third insulating layer stacked on the third interconnection layer, and the third interconnection layer is electrically connected to the first package and the second package.

9. The semiconductor package as claimed in claim 7, wherein
the integrated stack capacitor is between a lower surface of the memory chip and the substrate, and
wherein the second package is electrically connected to the integrated stack capacitor and the capacitor structure.

10. A semiconductor package, comprising:
a first package and a second package,
wherein the first package includes:
   an integrated stack capacitor (ISC) including a first surface and a second surface opposite to the first surface;
   a memory chip having one surface on the first surface of the ISC and including a plurality of memory cells;
   a capacitor structure disposed independently of the memory chip; and
   a printed circuit board (PCB) on which the memory chip and the capacitor structure are mounted,
wherein the second package includes a logic chip having one surface on the second surface of the ISC and being configured to access the memory cell,
wherein the ISC is electrically connected to the memory chip and electrically connected to the logic chip,
wherein the ISC extends across and contacts a surface of the memory chip and a surface of the capacitor structure, and
wherein the PCB is positioned between the logic chip and the memory chip and the capacitor structure.

11. The semiconductor package as claimed in claim 10, wherein
the PCB has one surface on the second surface of the ISC,
wherein the first package includes a plurality of solder balls on another surface of the PCB, and
wherein the second package includes the logic chip electrically connected to the plurality of solder balls.

12. The semiconductor package as claimed in claim 10, further comprising:
a substrate on another surface of the logic chip; and
a molding part surrounding the memory chip, the ISC, and the logic chip.

13. A semiconductor package, comprising:
a first package and a second package on a lower surface of the first package,
wherein the first package includes:
   a memory chip including a memory cell;
   a capacitor structure disposed independently of the memory chip;
   an integrated stack capacitor (ISC) electrically connected to the memory chip and electrically connected to logic chip, and
   a printed circuit board (PCB) on which the memory chip and the capacitor structure are mounted,
wherein the second package includes the logic chip configured to access the memory cell,
wherein the ISC extends across and contacts a surface of the memory chip and a surface of the capacitor structure, and
the PCB is positioned between the logic chip and the memory chip and the capacitor structure.

14. The semiconductor package as claimed in claim 13, wherein
the PCB includes at least one first interconnection layer; and
wherein the first package includes at least one wire electrically connecting the PCB to the ISC.

15. The semiconductor package as claimed in claim 14, wherein the second package further includes:
a second interconnection structure including at least one second interconnection layer, the logic chip being on an upper surface of the second interconnection structure;
at least one via electrically connecting the PCB to the second interconnection layer; and
a second molding part between the PCB and the second interconnection structure.

16. The semiconductor package as claimed in claim 13, wherein the semiconductor package includes a substrate,
wherein the first package and the second package are separated from each other on a first surface of the substrate,
wherein the PCB includes at least one first interconnection layer,
wherein the first package includes:
   the memory chip on one portion of an upper surface of the PCB;
   the capacitor structure on remaining portions of the upper surface of the PCB;
   the ISC having one surface on a lower surface of the PCB;
   first solder balls between another surface of the ISC and the first surface of the substrate; and
   a first molding part surrounding the memory chip, the capacitor structure, and the ISC, and
wherein the second package includes the logic chip sharing the ISC and the capacitor structure.

17. The semiconductor package as claimed in claim 16, wherein the second package further includes:
a second interconnection structure including at least one second interconnection layer, the logic chip being on an upper surface of the second package;
at least one second solder ball on a lower surface of the second interconnection structure; and
a second molding part surrounding the logic chip.

18. The semiconductor package as claimed in claim 16, wherein the substrate includes:
a third insulating layer between the first package and the second package and the first surface; and
a third interconnection layer under the third insulating layer and electrically connected to the first package and the second package.

19. The semiconductor package as claimed in claim 13, wherein:
the memory chip is on a first surface of the ISC, and
the logic chip is on a second surface of the ISC, the second surface being opposite to the first surface of the ISC.

20. The semiconductor package as claimed in claim 19, further comprising a through-via passing through the ISC and directly electrically connecting the memory chip to the logic chip.

21. The semiconductor package as claimed in claim 1, wherein the ISC is included in the first package.

* * * * *